(12) United States Patent
Kashiwazaki

(10) Patent No.: US 11,587,820 B2
(45) Date of Patent: Feb. 21, 2023

(54) MOUNTING TABLE, SUBSTRATE PROCESSING APPARATUS, AND CONTROL METHOD

(71) Applicant: TOKYO ELECTRON LIMITED, Tokyo (JP)

(72) Inventor: Masakatsu Kashiwazaki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 394 days.

(21) Appl. No.: 16/728,121

(22) Filed: Dec. 27, 2019

(65) Prior Publication Data

US 2020/0211892 A1 Jul. 2, 2020

(30) Foreign Application Priority Data

Dec. 28, 2018 (JP) .............................. JP2018-248269

(51) Int. Cl.
| | |
|---|---|
| *H01L 21/687* | (2006.01) |
| *H01L 21/683* | (2006.01) |
| *H01J 37/32* | (2006.01) |

(52) U.S. Cl.
CPC .. *H01L 21/68742* (2013.01); *H01J 37/32724* (2013.01); *H01L 21/6833* (2013.01); *H01L 21/6875* (2013.01); *H01J 2237/002* (2013.01); *H01J 2237/20235* (2013.01)

(58) Field of Classification Search
CPC ....... H01J 2237/20235; H01J 37/32724; H01J 2237/002; H01J 37/32513; H01L 21/68742; H01L 21/6833; H01L 21/6875; H01L 21/67109; H01L 21/67248
See application file for complete search history.

(56) References Cited

U.S. PATENT DOCUMENTS

| | | | |
|---|---|---|---|
| 2002/0014894 A1* | 2/2002 | Yonezawa | G01R 31/2865 324/750.08 |
| 2006/0075969 A1* | 4/2006 | Fischer | H01L 21/6875 257/E21.252 |
| 2017/0133245 A1* | 5/2017 | Iizuka | H01L 21/67069 |
| 2018/0286645 A1* | 10/2018 | Kawamata | C23C 14/505 |

FOREIGN PATENT DOCUMENTS

JP 2014-195047 A 10/2014

* cited by examiner

*Primary Examiner* — Ram N Kackar
*Assistant Examiner* — Laureen Chan
(74) *Attorney, Agent, or Firm* — Weihrouch IP (57) ABSTRACT

A mounting table is provided. The mounting table includes a base having a first flow path, a recess, and a second flow path connected to the recess, and a variable control mechanism configured to variably control a contact area between a target object disposed on the base and a mounting surface for mounting thereon the target object by filling and discharging fluid into and from the recess through the second flow path.

7 Claims, 6 Drawing Sheets

MOUNTING TABLE, SUBSTRATE PROCESSING APPARATUS, AND CONTROL METHOD

CROSS-REFERENCE TO RELATED APPLICATIONS

This application claims priority to Japanese Patent Application No. 2018-248269, filed on Dec. 28, 2018, the entire contents of which are incorporated herein by reference.

TECHNICAL FIELD

The present disclosure relates to a mounting table, a substrate processing apparatus, and a control method.

BACKGROUND

A technique for improving in-plane uniformity of wafer processing by making the in-plane temperature of a wafer uniform has been proposed. For example, Japanese Patent Application Publication No. 2014-195047 discloses a structure for controlling the in-plane temperature of a wafer by setting the density of dot-shaped protrusions formed on the mounting surface of a mounting table for mounting thereon the wafer to be different at a central region and a peripheral region.

The present disclosure provides a technique capable of variably controlling a contact area between a mounting surface and a target object.

SUMMARY

In accordance with an aspect of the present disclosure, there is provided a mounting table including: a base having a first flow path, a recess, and a second flow path connected to the recess; and a variable control mechanism configured to variably control a contact area between a target object disposed on the base and a mounting surface for mounting thereon the target object by filling and discharging fluid into and from the recess through the second flow path.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments will be described in detail with reference to the accompanying drawings. Like reference numerals will be given to like parts throughout the drawings, and redundant description thereof will be omitted.

<Substrate Processing Apparatus>

Figure 1:
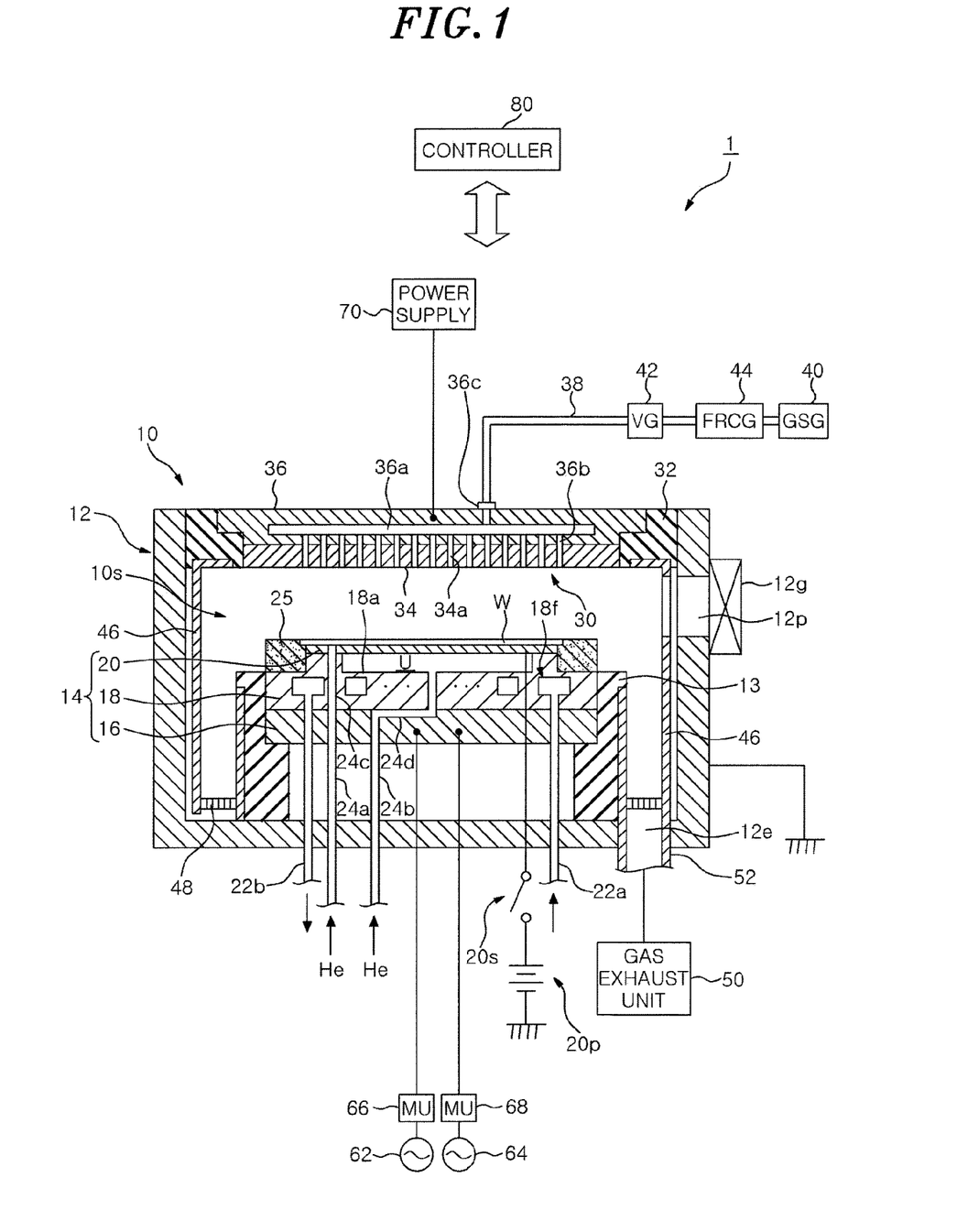
FIG. 1 is a schematic cross-sectional view showing an example of a substrate processing apparatus according to an embodiment.

First, a substrate processing apparatus 1 according to an embodiment will be described with reference to FIG. 1. FIG. 1 is a schematic cross-sectional view showing an example of a substrate processing apparatus 1 according to the embodiment.

The substrate processing apparatus 1 includes a chamber 10. The chamber 10 has an inner space 10s therein. The chamber 10 includes a chamber body 12. The chamber body 12 has a substantially cylindrical shape. The chamber body 12 is made of, e.g., aluminum. A corrosion resistant film is formed on an inner wall surface of the chamber body 12. This film may be a ceramic film made of aluminum oxide, yttrium oxide, or the like.

A passage 12p is formed on a sidewall of the chamber body 12. The wafer W is transferred between the inner space 10s and the outside of the chamber 10 through the passage 12p. The passage 12p is opened and closed by a gate valve 12g disposed along the sidewall of the chamber body 12.

A support 13 is provided on a bottom portion of the chamber body 12. The support 13 is made of an insulating material. The support 13 has a substantially cylindrical shape. The support 13 extends upward from the bottom portion of the chamber body 12 in the inner space 10s. A mounting table 14 is arranged at an upper portion of the support 13. The mounting table 14 supports a wafer W in the inner space 10s.

The mounting table 14 includes a base 18 and an electrostatic chuck 20. The mounting table 14 may further include an electrode plate 16. The electrode plate 16 is made of a conductor such as aluminum or the like and has a substantially disc shape. The base 18 is disposed on the electrode plate 16. The base 18 is made of a conductor such as aluminum or the like and has a substantially disc shape. The base 18 is electrically connected to the electrode plate 16.

Figure 2A:
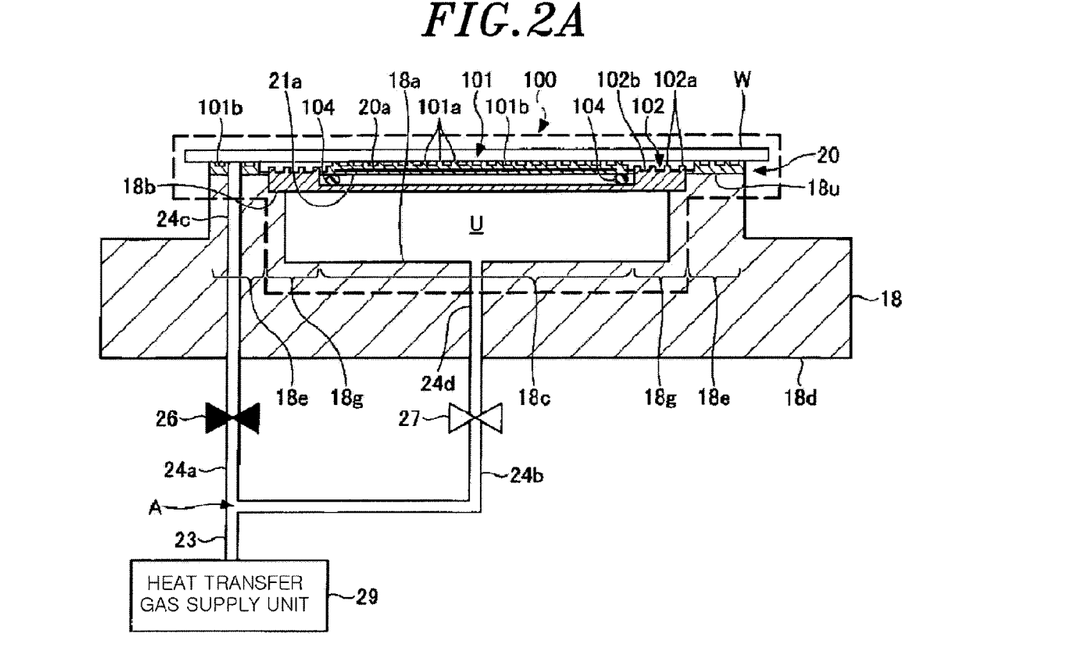
FIGS. 2A and 2B are schematic cross-sectional views of a mounting table according to the embodiment.
Figure 2B:
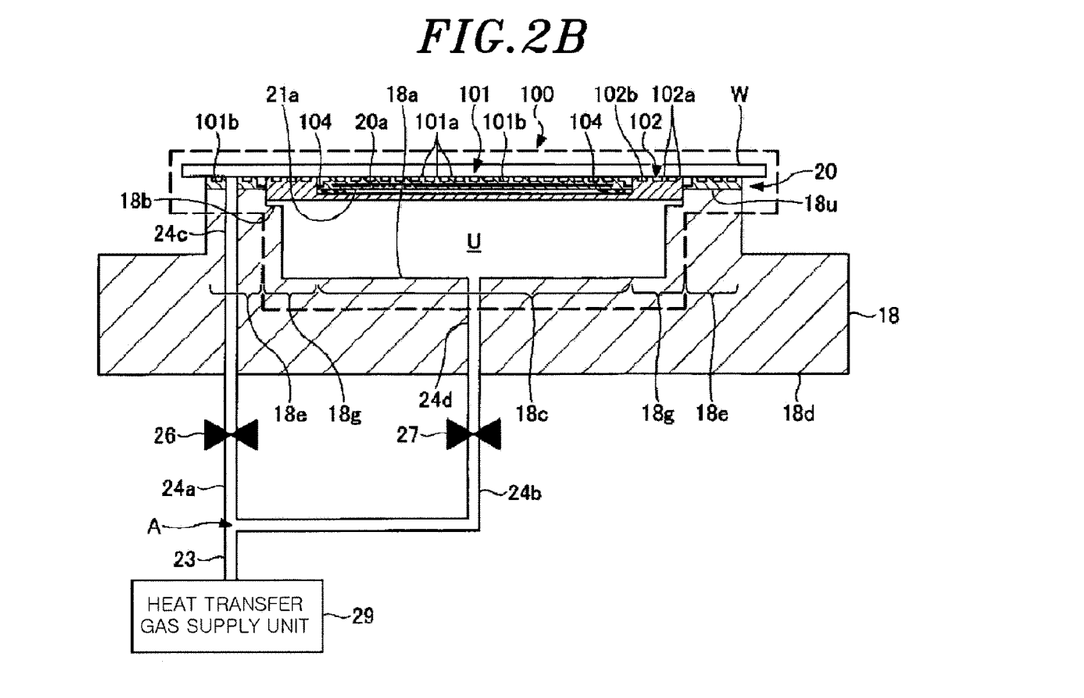

The electrostatic chuck 20 is disposed on the base 18. A surface of the electrostatic chuck 20 serves as a mounting surface on which the wafer W is mounted. As shown in FIGS. 2A and 2B, the electrostatic chuck 20 has a main body 21a made of a pair of insulating films and a film-shaped electrode 20a embedded in between the pair of films in the main body 21a. The electrostatic chuck 20 has a substantially disc shape and is made of a dielectric material.

Referring back to FIG. 1, the electrode of the electrostatic chuck 20 is connected to a DC power supply 20p through a switch 20s. When a voltage from the DC power supply 20p is applied to the electrode of the electrostatic chuck 20, an electrostatic attractive force is generated between the electrostatic chuck 20 and the wafer W. The wafer W is attracted to and held on the electrostatic chuck 20 by the generated electrostatic attractive force.

An edge ring 25 is disposed on a peripheral portion of the base 18 to surround the edge of the wafer W. The edge ring 25 is also referred to as "focus ring." The edge ring 25 improves in-plane uniformity of plasma processing on the wafer W. The edge ring 25 may be made of silicon, silicon carbide, quartz, or the like.

A flow path 18f is formed in the base 18. A heat exchange medium (e.g., a coolant) is supplied from a chiller unit (not shown) disposed outside the chamber 10 to the flow path 18f through a line 22a. The heat exchange medium supplied to the flow path 18f is returned to the chiller unit through a line 22b. In the substrate processing apparatus 1, a temperature of the wafer W mounted on the electrostatic chuck 20 is controlled by heat exchange between the heat exchange medium and the base 18. The flow path formed by the lines 22a and 22b is an example of a first flow path.

The substrate processing apparatus 1 further includes coolant lines 24a and 24b. The lines 24a and 24b supply helium (He) gas that is an example of a heat transfer gas from a heat transfer gas supply unit 29. The line 24a is connected to a coolant flow path 24c formed in the base 18, and He gas is supplied through the line 24a to a gap between the surface of the electrostatic chuck 20 and a backside surface of the wafer W. The line 24b is connected to a coolant flow path 24d formed in the base 18, and He gas is supplied through the line 24b to a space U defined by a recess 18a formed at an upper portion of the base 18 and the electrostatic chuck 20. The heat transfer gas supplied from the heat transfer gas supply unit 29 may be any inert gas. The flow path formed by the line 24b and the flow path 24d is an example of a second flow path connected to the recess 18a.

The substrate processing apparatus 1 further includes an upper electrode 30. The upper electrode 30 is disposed above the mounting table 14. The upper electrode 30 is supported at the upper portion of the chamber body 12 via a member 32. The member 32 is made of an insulating material. The upper electrode 30 and the member 32 block an upper opening of the chamber body 12.

The upper electrode 30 may include a ceiling plate 34 and a holder 36. A bottom surface of the ceiling plate 34 faces the inner space 10s and defines the inner space 10s. The ceiling plate 34 may be formed of a semiconductor or a low-resistance conductor with a low Joule heating. The ceiling plate 34 has a plurality of gas injection holes 34a extending through the ceiling plate 34 in a thickness direction thereof.

The holder 36 detachably holds the ceiling plate 34. The holder 36 is made of a conductive material such as aluminum or the like. A gas diffusion space 36a is formed in the holder 36. The holder 36 has a plurality of gas holes 36b extending downward from the gas diffusion space 36a. The gas holes 36b communicate with the gas injection holes 34a, respectively. A gas inlet port 36c is formed at the holder 36. The gas inlet port 36c is connected to the gas diffusion space 36a. A gas supply line 38 is connected to the gas inlet port 36c.

The gas supply line 38 is connected to a valve group (VG) 42, a flow rate controller group (FRCG) 44, and a gas source group (GSG) 40. The gas source group 40, the valve group 42, and the flow rate controller group 44 constitute a gas supply unit. The gas source group 40 includes a plurality of gas sources. The valve group 42 includes a plurality of opening/closing valves. The flow rate controller group 44 includes a plurality of flow rate controllers. Each of the flow rate controllers of the flow rate controller group 44 is a mass flow controller or a pressure control type flow controller. The gas sources of the gas source group 40 are connected to the gas supply line 38 through the corresponding opening/closing valves of the valve group 42 and the corresponding flow rate controllers of the flow rate controller group 44.

In the substrate processing apparatus 1, a shield 46 is detachably disposed along the inner wall surface of the chamber body 12 and the outer periphery of the support 13. The shield 46 prevents reaction by-products from being adhered to the chamber body 12. For example, the shield 46 has a structure in which a corrosion resistant film is formed on a surface of an aluminum base material. The corrosion resistant film may be a ceramic film made of yttrium oxide or the like.

A baffle plate 48 is disposed between the support 13 and the sidewall of the chamber body 12. For example, the baffle plate 48 has a structure in which a corrosion resistance film (film made of yttrium oxide or the like) is formed on a surface of an aluminum base material. The baffle plate 48 has a plurality of through-holes. A gas exhaust port 12e is formed below the baffle plate 48 or at a bottom portion of the chamber body 12. A gas exhaust unit 50 is connected to the gas exhaust port 12e through a gas exhaust line 52. The gas exhaust unit 50 includes a vacuum pump such as a pressure control valve, a turbo molecular pump, or the like.

The substrate processing apparatus 1 includes a first high frequency power supply 62 and a second high frequency power supply 64. The first high frequency power supply 62 generates a first high frequency power having a frequency suitable for plasma generation. The first high frequency power has a frequency within a range of, e.g., 27 MHz to 100 MHz. The first high frequency power supply 62 is connected to the base 18 through a matching unit (MU) 66 and the electrode plate 16. The matching unit 66 has a circuit for matching an output impedance of the first high frequency power supply 62 with an impedance of a load side (the base 18 side). The first high frequency power supply 62 may be connected to the upper electrode 30 through the matching unit 66. The first high frequency power supply 62 constitutes an example of a plasma generation unit.

The second high frequency power supply 64 generates a second high frequency power having a frequency lower than that of the first high frequency power. In the case of using both of the first high frequency power and the second high frequency power, the second high frequency power is used as a bias high frequency power for attracting ions to the wafer W. The frequency of the second high frequency power is within a range of, e.g., 400 kHz to 13.56 MHz. The second high frequency power supply 64 is connected to the base 18 through a matching unit (MU) 68 and the electrode plate 16. The matching unit 68 has a circuit for matching an output impedance of the second high frequency power supply 64 with the impedance of the load side (the base 18 side).

The plasma may be generated using only one high frequency power, i.e., using the second high frequency power, without using the first high frequency power. In this case, the frequency of the second high frequency power may be higher than 13.56 MHz, e.g., 40 MHz. The substrate processing apparatus 1 may not include the first high frequency power supply 62 and the matching unit 66. The second high frequency power supply 64 constitutes an example of the plasma generation unit.

In the substrate processing apparatus 1, a gas is supplied from the gas supply unit to the inner space 10s. A high frequency electric field is generated between the upper electrode 30 and the base 18 by supplying the first high frequency power and/or the second high frequency power. The generated high frequency electric field generates plasma from the gas.

The substrate processing apparatus 1 includes a power supply 70. The power supply 70 is connected to the upper electrode 30. The power supply 70 applies, to the upper electrode 30, a voltage for attracting positive ions in the inner space 10s to the ceiling plate 34.

The substrate processing apparatus 1 may further include a controller 80. The controller 80 may be a computer including a processor, a storage unit such as memory or the like, an input device, a display device, a signal input/output interface, and the like. The controller controls the respective components of the substrate processing apparatus 1. In the controller 80, an operator can input a command to manage the substrate processing apparatus 1 using the input device. Further, in the controller 80, an operational status of the substrate processing apparatus 1 can be visualized and displayed by the display device. A control program and recipe data are stored in the storage unit. The control program is executed by the processor to perform various processes in the substrate processing apparatus 1. The processor executes a control program to control the respective components of the substrate processing apparatus 1 based on the recipe data. The storage unit of the controller 80 stores a control program for controlling various processes performed by the substrate processing apparatus 1 under the control of the processor, or a program, i.e., a processing recipe, for causing the respective components of the substrate processing apparatus 1 to perform processes based on the processing conditions.

<Mounting Table>

Next, the mounting table 14 of the substrate processing apparatus 1 will be described in detail. FIGS. 2A and 2B are schematic cross-sectional views showing the mounting table 14 according to the embodiment. Referring to FIGS. 2A and 2B, the base 18 has a bottom surface 18d and an upper surface 18u. The bottom surface 18d is a substantially flat surface, and the upper surface 18u is an annular surface. A substantially cylindrical recess 18a is formed in an inner side of the upper surface 18u, and a bottom surface of the recess 18a is lower than the upper surface 18u. A stepped portion 18b is formed between the bottom surface of the recess 18a and the upper surface 18u, to be positioned lower than the upper surface 18u and higher than the bottom surface of the recess 18a.

The base 18 has a central portion 18c, an intermediate portion 18g, and a peripheral portion 18e. An upper surface of the central portion 18c corresponds to a central region of the bottom surface of the recess 18a. An upper surface of the peripheral portion 18e corresponds to a region of the upper surface 18u. An upper surface of the intermediate portion 18g corresponds to a peripheral region on the bottom surface of the recess 18a and a region of the stepped portion 18b.

Flow paths 24c and 24d are formed in the peripheral portion 18e and the central portion 18c, respectively. For example, the flow path 24c extends from the peripheral portion 18e of the base 18 and He gas is supplied through the flow path 24c to a gap between the backside surface of the wafer W and the surface of the electrostatic chuck 20 at the outer peripheral side of the wafer W. The flow path 24d extends from the central portion 18c of the base 18 and He gas is supplied through the flow path 24d to the space U in the recess 18a formed in the central portion 18c and the intermediate portion 18g of the base 18.

Figure 3A:
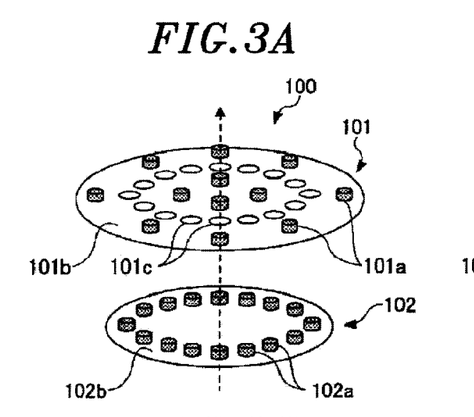
FIGS. 3A to 3F show examples of an electrode of a variable control mechanism according to the embodiment.

The electrostatic chuck 20 is disposed on the base 18. The electrostatic chuck 20 includes a first member 101 and a second member 102. FIG. 3A shows examples of the first member 101 and the second member 102. The first member 101 has a disc shape, and a plurality of protrusions 101a are formed in a dot shape on a surface 101b of the first member 101. The second member 102 has a disc shape, and a plurality of protrusions 102a are formed in a dot shape on a surface 102b of the second member 102. The first member 101 has an electrode 20a between insulators. The second member 102 is made of an insulator and does not have an electrode. In the embodiment, the protrusions 101a and 102a have the same shape and the same size, but the shape and size of the protrusions 101a and 102a are not limited thereto. Further, in FIG. 3A, the number of the protrusions 101a and the number of the protrusions 102a are simplified.

A mechanism for variably controlling a contact area between the backside surface of the wafer W and the mounting surface (hereinafter, also referred to as "variable control mechanism 100") includes the first member 101, the second member 102, and a gas supply unit 29 for supplying He gas to the space U.

The first member 101 and the second member 102 are arranged concentrically, and the second member 102 has a diameter smaller than that of the first member 101. The first member 101 has a plurality of through-holes 101c formed at positions corresponding to the protrusions 102a of the second member 102. When the second member 102 is lifted, the protrusions 102a penetrate through the through-holes 101c. Accordingly, the second member 102 can be lifted until the heights of the upper surfaces of the protrusions 102a coincide with those of the upper surfaces of the protrusions 101a.

Referring back to FIGS. 2A and 2B, the first member 101 is fixed on the upper surface 18u at the peripheral portion 18e of the base 18. Therefore, by fixing the first member 101, the first member 101 is not moved. The second member 102 is disposed below the first member 101 and is not fixed. Thus, the second member 102 can be moved. An O-ring 104 is disposed between the first member 101 and the second member 102.

The O-ring is disposed on an outer peripheral side of the central portion 18c of the base 18 and seals the inner space 10s having the vacuum atmosphere from the space U having the atmospheric atmosphere. The O-ring 104 is an example of an elastic member that seals the inner space 10s having the vacuum atmosphere from the space U having the atmospheric atmosphere, but is not limited thereto. For example, the elastic member may be a magnetic fluid seal or a metal seal.

Figure 4:
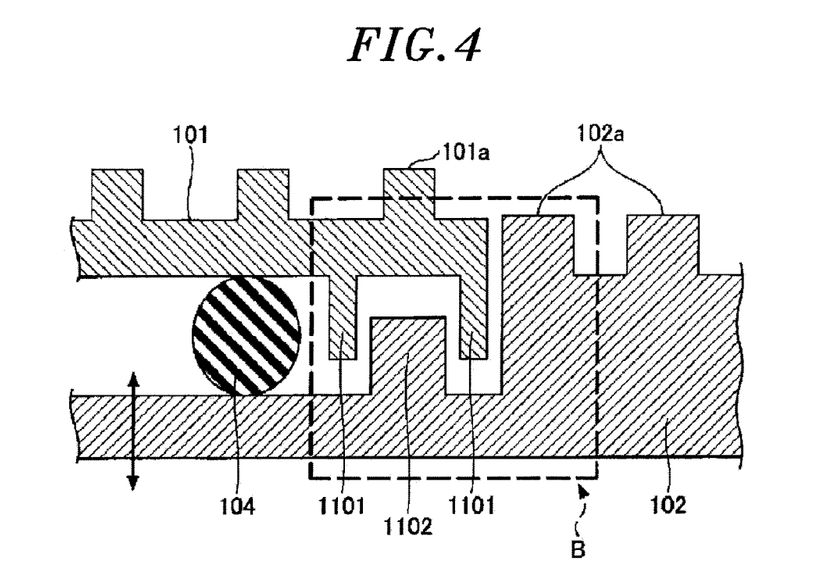
FIG. 4 shows an example of a labyrinth structure of the variable control mechanism according to the embodiment.

As shown in FIG. 4, the first member 101 and the second member 102 may have a labyrinth structure B at the outer side of the O-ring 104. In the example of FIG. 4, the second member 102 has an isolation wall 1102 that is disposed close to the protrusions 102a and positioned at an inner side of the protrusions 102a while the height of the isolation wall 1102 is lower than the heights of the protrusions 102a. The first member 101 has two vertical walls 1101 extending vertically at a side opposite to the side where the protrusions 101a are formed. The isolation wall 1102 extends between the two vertical walls 1101 such that the upper end of the isolation wall 1102 becomes higher than the lower ends of the vertical walls 1101, thereby forming the labyrinth structure B. The labyrinth structure B prevents the plasma from coming in contact with the O-ring 104, thereby protecting the O-ring 104 from the plasma. In addition, the labyrinth structure B can prevent an occurrence of abnormal discharge near the O-ring 104. Therefore, it is preferred that the variable control mechanism 100 has the labyrinth structure B.

The operation of the variable control mechanism 100 will be described with reference to FIGS. 2A and 2B. He gas is supplied from a heat transfer gas supply unit 29 and flows through a line 23. Then, the He gas flow branches at a branch portion A to the lines 24a and 24b. An opening/closing valve 26 is disposed in the line 24a, and an opening/closing valve 27 is disposed in the line 24b. By opening and closing the opening/closing valve 26, it is possible to control the supply or the shut-off of the supply of He gas to the gap between the surface of the electrostatic chuck 20 and the backside surface of the wafer W through the flow path 24c. Further, by opening and closing the opening/closing valve 27, it is possible to control the supply or the shut-off of the supply of He gas to the space U through the flow path 24d.

The controller 80 controls the vertical movement of the second member 102 by controlling the opening and closing of the opening/closing valve 27 and the flow rate of He gas introduced into the space U. In a state shown in FIG. 2A, the opening/closing valve 26 is opened and the opening/closing valve 27 is closed. Therefore, He gas is supplied from the outer peripheral side of the wafer W to the gap between the backside surface of the wafer W and the surface 101b of the first member 101. Accordingly, heat transfer between the electrostatic chuck 20 and the wafer W is improved.

While He gas is not introduced into the space U, or while He gas is introduced into the space U but a pressure in the space U is lower than a predetermined pressure, the second member 102 is disposed on the stepped portion 18b in the intermediate portion 18g.

In the state of FIG. 2A, He gas is not supplied to the space U, so that the backside surface of the second member 102 is in contact with the stepped portion 18b. In this state, the backside surface of the wafer W is in contact with the protrusions 101a of the first member 101 without being in contact with the protrusions 102a of the second member 102. In this state, the surface in contact with the wafer W, i.e., the mounting surface, corresponds to the upper surfaces of the protrusions 101a.

When the pressure in the space U becomes higher than or equal to the predetermined pressure by He gas introduced into the space U, the second member 102 is separated from the stepped portion 18b and starts to move upward. When the pressure in the space U is further increased, the protrusions 102a penetrate through the through-holes 101c of the first member 101 and the second member 102 is raised to a position where the protrusions 102a are brought into contact with the wafer W, as shown in FIG. 2B. In this state, the surface in contact with the wafer W, i.e., the mounting surface, corresponds to the upper surfaces of the protrusions 101a and the upper surfaces of the protrusions 102a.

As described above, the variable control mechanism 100 is configured to variably control the mounting surface by vertically moving the second member 102 by filling and discharging He gas into and from the space U. This variable control is performed during the wafer processing or before and after the wafer processing to thereby control the contact area between the wafer W and the electrostatic chuck 20. As a result, the temperature of the wafer W can be controlled.

The flow path 24c is referred to as "first path," and the flow path 24d is referred to as "second path." Normally, He gas is continuously supplied to the flow path 24c during the wafer processing or before and after the wafer processing. In other words, the opening/closing valve 26 is normally maintained in an open state. However, the supply and the shut-off of the supply of He gas to the flow path 24c may be controlled by controlling the opening and closing of the opening/closing valve 26 in response to the vertical movement of the second member 102.

In the above-described embodiment, the mechanism for supplying He gas includes the two path including the two flow paths 24c and 24d. However, the present disclosure is not limited thereto. For example, the flow path 24c of the first path may be branched to supply He gas to the space U therefrom.

In the above-described variable control mechanism 100, the protrusions 101a are formed on the surface 101b of the first member 101 and the protrusions 102a are formed on the surface 102b of the second member 102. However, the present disclosure is not limited thereto. For example, instead of the protrusions 101a and 102a, depressions may be formed on the surfaces 101b and 102b. Alternatively, the protrusions 101a and 102a may be formed together with the depressions. In the case where the depressions are formed, the surface in contact with the wafer W, i.e., the mounting surface, corresponds to the surface 101b (when the second member 102 is not in contact with the wafer W) or the surfaces 101b and 102b (when the second member 102 is in contact with the wafer W).

In the above-described embodiment, the variable control mechanism 100 is configured to vertically move the protrusions 102a of the second member 102 as a whole. However, the present disclosure is not limited thereto. For example, the variable control mechanism 100 may be configured to vertically move the protrusions 102a individually. In other words, the second member 102 may be configured such that the protrusions 102a are vertically moved one by one, or two or more protrusions 102a are vertically moved together, or the protrusions 102a are moved as a whole.

In addition, the second member 102 may be configured to have no protrusion and/or depression, and the second member 102 having no protrusion and/or depression may be vertically moved to bring the surface 102b into contact with the backside surface of the wafer W.

Further, in the above-described embodiment, the protrusions 102a of the second member 102 are not in contact with the backside surface of the wafer W before the space U is filled with He gas. The protrusions 102a of the second member 102 are brought into contact with the backside surface of the wafer W by filling the space U with He gas. However, it is also possible to bring the protrusions 102a of the second member 102 into contact with the backside surface of the wafer W by filling the space U with He gas in an initial state and to separate the protrusions 102a from the backside surface of the wafer W by discharging He gas from the space U. Alternatively, it is also possible to bring the protrusions 102a of the second member 102 into contact with the backside surface of the wafer W in an initial state and to separate the protrusions 102a from the backside surface of the wafer W by pressing down the second member 102 by supplying He gas to the space between the first member 101 and the second member 102.

Figure 3B:
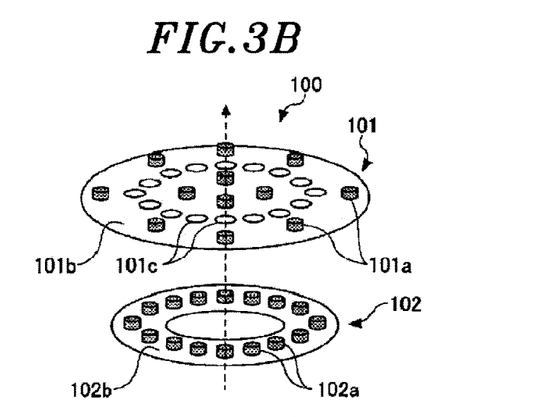
Figure 3C:
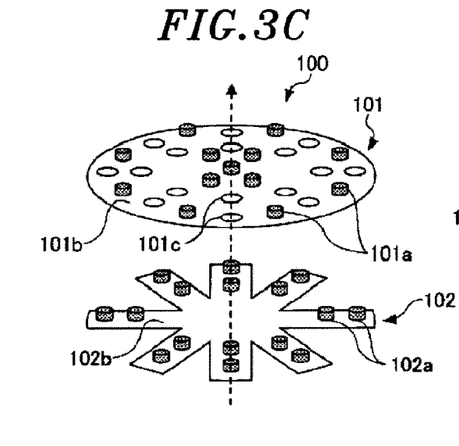

In the examples of FIGS. 3A to 3D, the first member 101 has an electrode to be connected to the DC power supply 20p, and the second member 102 has no electrode. In the examples of FIGS. 3A to 3C, as long as the through-holes 101c of the first member 101 are provided in one-to-one correspondence with the protrusions 102a of the second member, the shape of the second member 102, and the arrangement and the number of the protrusions 102a of the second member may vary freely.

Figure 3D:
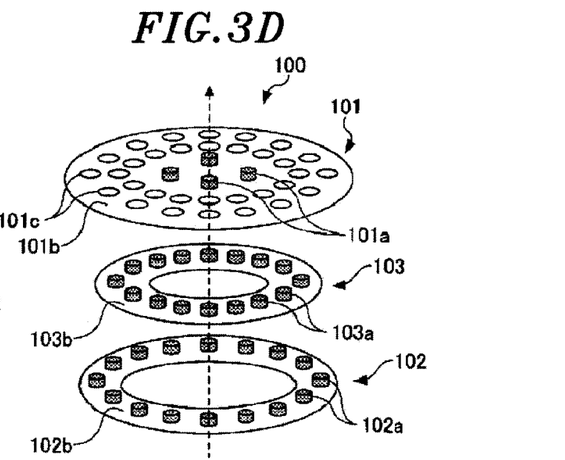

Further, as shown in the example of FIG. 3D, the variable control mechanism 100 may include the first member 101, the second member 102, and a third member 103 such that the variable control mechanism 100 is configured to vertically move the second member 102 and the third member 103. In this case as well, as long as the through-hole 101c of the first member 101 are provided in one-to-one correspondence with the protrusions 102a and 103a, the shapes of the second member 102 and the third member 103, and the arrangement and the number of the protrusion 102a and 103a may vary freely. As for a mechanism for vertically moving the third member 103, a space is partitioned from the space U below the third member 103, and He gas is filled and discharged into and from the partitioned space to thereby vertically move the protrusions 103a of the third member 103. Accordingly, the variable control mechanism 100 variably and more precisely controls the mounting surface by individually controlling the vertical movements of the second member 102 and the third member 103.

Figure 3E:
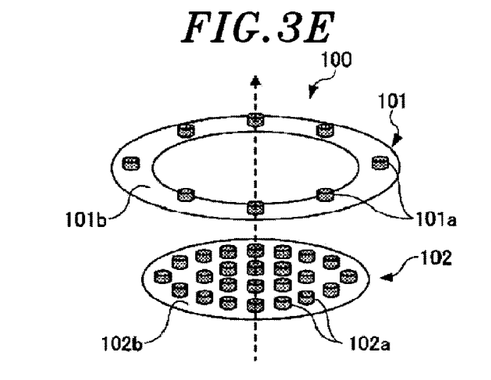

In the example of FIG. 3E, the electrode is divided into two parts. That is, the first member 101 and the second member 102 respectively have electrodes to be connected to the DC power supply 20p. The first member 101 is formed in a ring shape. Therefore, when the second member 102 is raised, the protrusions 102a protrude upward from the first member 101 at an inner side of the ring-shaped first member 101 to come into contact with the wafer W.

Figure 3F:
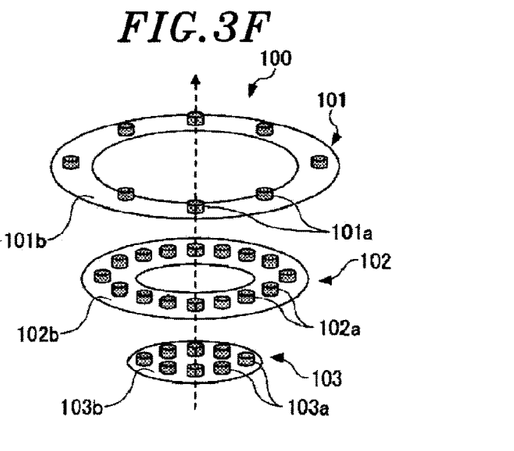

In the example of FIG. 3F, the electrode is divided into three parts. That is, the first member 101, the second member 102, and the third member 103 respectively have electrodes to be connected to the DC power supply 20p. Each of the first member 101 and the second member 102 is formed in a ring shape. Therefore, when the second member 102 is raised, the protrusions 102a protrude upward from the first member 101 at an inner side of the ring-shaped first member 101 to come into contact with the wafer W. Further, when the third member 103 is raised, protrusions 103a protrude upward from the first member 101 and the second member 102 at inner sides of the ring-shaped first and second members 101 and 102 to come into contact with the wafer W.

The variable control mechanism 100 configured as described above vertically moves one or more divided portions of the mounting surface during the wafer processing or before and after the wafer processing, thereby controlling the contact area between the wafer W and the electrostatic chuck 20. Therefore, the temperature of the wafer W can be controlled. In the case of dividing the electrode into the plurality of electrodes, the inner peripheral surface of the first member 101 and the outer peripheral surface of the second member 102 are partially overlapped in a plan view, and the O-ring 104 is disposed at the overlapping portion. Further, the inner peripheral surface of the second member 102 and the outer peripheral surface of the third member 103 are partially overlapped in a plan view, and the O-ring 104 may be disposed at the overlapping portion. Further, at least one of the first member 101, the second member 102, and the third member 103 may not have the protrusions or the depressions.

As described above, the mounting table 14 provided in the substrate processing apparatus 1 according to the present embodiment includes the base 18 and the variable control mechanism 100 for variably controlling the contact area between the wafer W on the base 18 and the mounting surface. Therefore, the mounting surface for mounting thereon the wafer W can be variably controlled during the wafer processing or before and after the wafer processing. Accordingly, the temperature of the wafer W can be controlled by changing the contact area between the wafer W and the electrostatic chuck 20.

(Modification)

Figure 5:
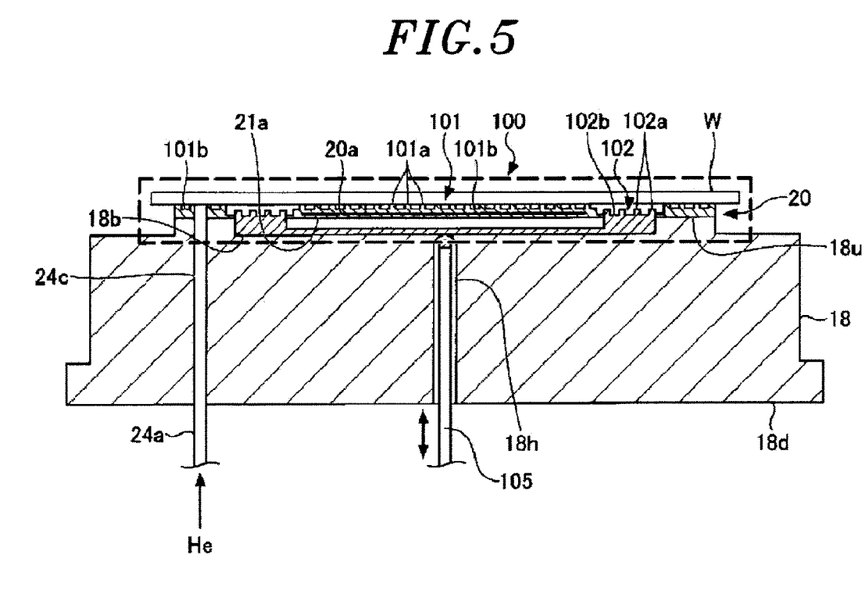
FIG. 5 shows an example of a variable control mechanism according to a modification.

As shown in FIG. 5, the surface 102b or one or more protrusions 102a on the surface 102b of the second member 102 may be vertically moved by a lifter pin(s) 105. For example, in the example of FIG. 5, the lifter pin 105 is inserted into a through-hole 18h formed in the base 18. The through-hole 18h can also serve as a coolant path. The lifter pin 105 is brought into contact with the backside surface of the second member 102 and vertically moves the second member 102. Further, multiple lifter pins 105 may be provided, and the multiple lifter pins 105 may control a vertical movement of the surface 102b of the second member 102 or vertical movements of one or more protrusions formed on the surface 102b of the second member 102. For example, the multiple lifter pins 105 are inserted into multiple flow paths, respectively, and control the vertical movement of the surface 102b of the second member 102 or the individual vertical movements of one or more protrusions on the surface 102b of the second member 102. Each lifter pin 105 may be lifted by an elevating mechanism or by expanding and contracting an air cylinder by controlling the on/off of the air supply from the air cylinder.

When the second member 102 is vertically moved by controlling the pressure in the space U as in the above-described embodiment, the heat transfer between the electrostatic chuck 20 and the wafer W can be controlled by controlling the degree of filling of the heat exchange medium into the space U. In comparison with the above-described embodiment, when the second member 102 is vertically moved by solid contact such as the lifter pin 105 or the like as in this modification, the heat transfer between the electrostatic chuck 20 and the wafer W can be more easily controlled.

<Control Method>

Hereinafter, an example of a control method during the wafer processing for the substrate processing apparatus according to the embodiment will be described. First, an example of a control method for a conventional substrate processing apparatus will be described with reference to the flowchart of FIG. 6. Then, the example of the control method during the wafer processing for the substrate processing apparatus according to the embodiment will be described with reference to the flowchart of FIG. 7. The wafer processing is controlled by the controller 80.

Figure 6:
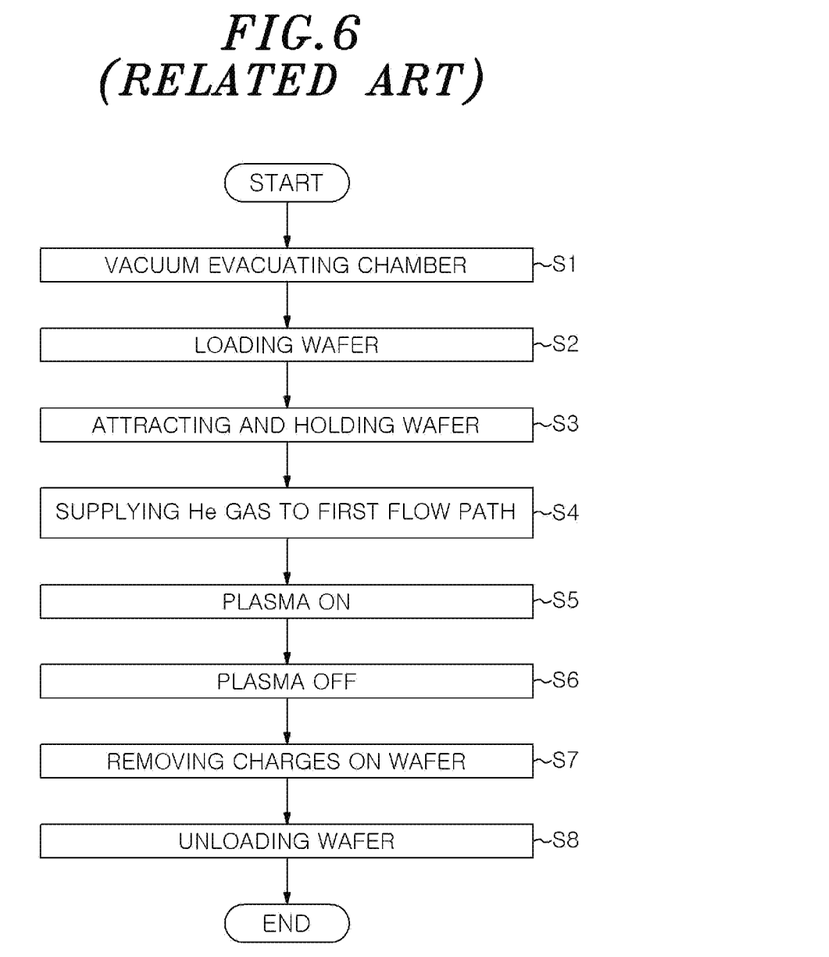
FIG. 6 is a flowchart showing an example of a control method for a conventional substrate processing apparatus.

In the control method for the conventional substrate processing apparatus shown in FIG. 6, the controller 80 executes depressurization and vacuum-evacuation of an inner space of the chamber 10 by using the gas exhaust unit 50 in step S1. Next, in step S2, the controller 80 executes a loading of the wafer W into the chamber 10. Then, in step S3, the controller 80 executes an application of a voltage from the DC power supply 20p to the electrode 20a. Accordingly, the wafer W is attracted to and held on the electrostatic chuck 20 by an electrostatic attractive force. Next, in step S4, the controller 80 executes a supply of He gas to the gap between the backside surface of the wafer W and the surface of the electrostatic chuck 20 through the flow path 24c of the first path.

Next, in step S5, the controller 80 executes a supply of a processing gas into the chamber 10 and controls the first high frequency power supply 62 and/or the second high frequency power supply 64 to apply the first high frequency power and/or the second high frequency power. Accordingly, plasma is generated (plasma is turned on) from the processing gas, and a predetermined plasma processing is performed on the wafer W.

Next, in step S6, the controller 80 stops the supply of the processing gas and stop the application of the first high frequency power and/or the second high frequency power to stop the generation of the plasma (plasma is turned off). Next, in step S7, the controller 80 executes an application of a voltage having the same magnitude but opposite polarity to that of the voltage applied during the plasma processing from the DC power supply 20p to the electrode 20a to remove charges remaining on the wafer W (de-chucking). Next, in step S8, the controller 80 executes an unloading of the wafer W after the de-chucking and terminates this processing.

Figure 7:
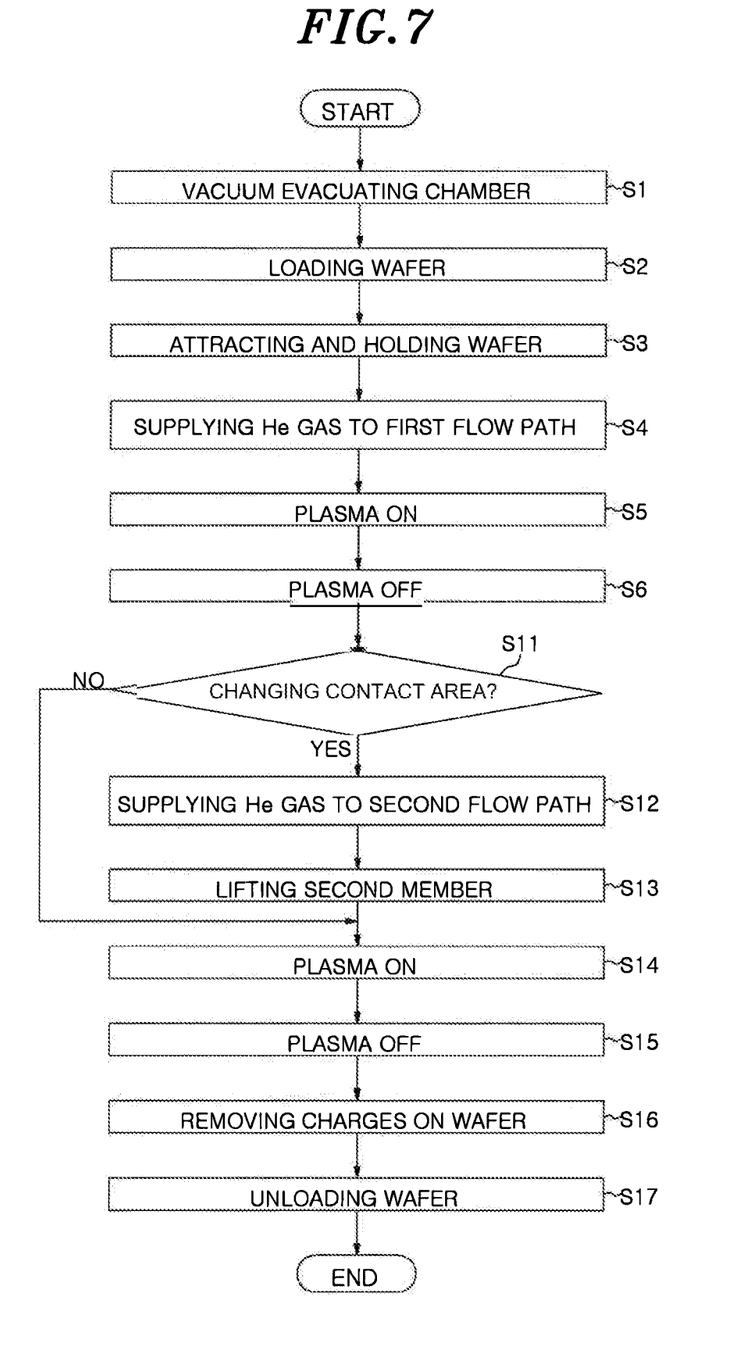
FIG. 7 is a flowchart showing an example of a control method for the substrate processing apparatus according to the embodiment.

In the control method for the substrate processing apparatus according to the present embodiment shown in FIG. 7, the processings in steps S1 to S6 are the same as the conventional wafer processings and, thus, redundant description thereof will be omitted. In step S11, subsequent to step S6, the controller 80 determines whether or not to change the contact area between the wafer W and the electrostatic chuck 20.

For example, when multiple processes are performed with respect to one wafer, the temperature of the electrostatic chuck 20 may be changed between the completion of one process and the start of a next process. For example, the temperature of the electrostatic chuck 20 is controlled to 60° C. in one process, and then controlled to 40° C. in a next process.

In that case, the controller 80 determines in step S11 to change the contact area between the wafer W and the electrostatic chuck 20. Then, in step S12, He gas is supplied through the flow path 24d of the second path, and the space U is filled with He gas. Next, in step S13, the controller 80 executes a lifting of the second member 102 by controlling the pressure in the space U by adjusting the flow rate of He gas to bring the protrusions 102a into contact with the backside surface of the wafer W.

Next, in step S14, the controller 80 performs plasma processing in a state where the protrusions 102a of the second member 102 are in contact with the wafer W. In other words, the plasma processing is performed in a state where the protrusions 101a of the first member 101 and the protrusions 102a of the second member 102 are in contact with the wafer W.

On the other hand, if the controller 80 determines in step S11 not to change the contact area between the wafer W and the electrostatic chuck 20, the processing immediately proceeds to step S14 and the plasma processing is performed in a state where the protrusions 102a of the second member 102 are not in contact with the wafer W. In other words, the plasma processing is performed in a state where the protrusions 101a of the first member 101 are merely in contact with the wafer W.

When the plasma processing on the wafer W is completed, the plasma is turned off in step S15. Since the processes of steps S16 and S17 are the same as the processes of steps S7 and S8 of FIG. 6, redundant description thereof will be omitted.

When the second member 102 is lowered after the completion of the plasma processing, a valve of a gas exhaust line (not shown) is opened to discharge He gas from the space U.

As described above, in accordance with the control method for the substrate processing apparatus according to the embodiment, the mounting surface can be variably controlled. Accordingly, the temperature of the wafer W mounted on the mounting surface can be controlled by changing the area of the mounting surface of the electrostatic chuck 20.

The mounting table, the substrate processing apparatus, and the control method according to the embodiments of the present disclosure are illustrative in all respects and are not restrictive. The above-described embodiments can be embodied in various forms. Further, the above-described embodiments may be omitted, replaced, or changed in various forms without departing from the scope of the appended claims and the gist thereof.

For example, the mounting table of the present disclosure may or may not have the electrostatic chuck. When the mounting table does not have the electrostatic chuck, members corresponding to the first member 101 and the second member 102 that can be brought into contact with the backside surface of the wafer W are disposed on the base 18.

The mounting table of the present disclosure may or may not have the electrode.

The medium supplied to the flow path 24c of the first path is used to improve the heat transfer efficiency on the vacuum side in the chamber 10. Therefore, the medium supplied to the flow path 24c is limited to an inert gas such as He gas or the like. On the other hand, the medium supplied to the flow path 24d of the second path is not just limited to gas and may be liquid. In other words, an inert gas such as He gas or the like, or fluid such as brine, water, or the like can be supplied to the flow path 24d of the second path.

The control method for the present disclosure can also be applied to the case where a contact area between the edge ring 25 and the electrostatic chuck 20 is changed to control the temperature of the edge ring 25. In this case, the electrostatic chuck 20 is provided with a line for supplying He gas to a mounting surface on which the edge ring 25 is mounted and a space to be filled with He gas. Alternatively, a lifter pin penetrating through the mounting surface for mounting thereon the edge ring 25 may be disposed at the electrostatic chuck 20. A member having the mounting surface that can be vertically movable below the edge ring is vertically moved by controlling the pressure by filling He gas into the space or by vertically moving the lifter pin. Accordingly, the contact area of a backside surface of the edge ring 25 and the mounting surface can be changed.

The substrate processing apparatus of the present disclosure can be applied to any type of substrate processing apparatus using a capacitively coupled plasma (CCP), an inductively coupled plasma (ICP), a radial line slot antenna (RLSA), an electron cyclotron resonance plasma (ECR), and a helicon wave plasma (HWP).

In the present disclosure, the wafer W has been described as an example of the target object. However, the target object is not limited thereto, and may be various substrates used in a flat panel display (FPD), a printed circuit board, and the like.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A mounting table comprising:
    a base having a first flow path, a recess, and a second flow path connected to the recess;
    an electrostatic chuck having a mounting surface comprising a first member that is fixed on an upper surface at a peripheral portion of the base and a second member that is not fixed; and
    a variable control mechanism comprising a heat transfer gas source and configured to variably control a contact area between a target object disposed on the base and the mounting surface of the electrostatic chuck for mounting thereon the target object by vertically moving the second member by filling and discharging the heat transfer gas into and from the recess through the second flow path.

2. The mounting table of claim 1, wherein the second member has one or more protrusions thereon, and the variable control mechanism controls vertical movements of said one or more protrusions.

3. The mounting table of claim 2, wherein the mounting table includes a plurality of second flow paths, each of which corresponds to the second flow path of claim 1, and
the variable control mechanism controls a vertical movement of the second member by filling and discharging the fluid into and from the recess through the respective second flow paths connected to the recess.

4. The mounting table of claim 1, wherein an elastic member is disposed between the first member and the second member.

5. The mounting table of claim 4, wherein the first member and the second member have a labyrinth structure at an outer side of the elastic member.

6. A substrate processing apparatus comprising:
a chamber;
a mounting table disposed in the chamber; and
a controller,
wherein the mounting table includes:
a base having a first flow path, a recess and a second flow path connected to the recess;
an electrostatic chuck having a mounting surface comprising a first member that is fixed on an upper surface at a peripheral portion of the base and a second member that is not fixed; and
a variable control mechanism comprising a heat transfer gas source and configured to variably control a contact area between a target object disposed on the base and the mounting surface of the electrostatic chuck for mounting thereon the target object by vertically moving the second member by filling and discharging the heat transfer gas into and from the recess through the second flow path.

7. A control method for controlling a contact area between a target object and a mounting surface of a mounting table, the mounting table including a base having a first flow path, a recess, and a second flow path connected to the recess, an electrostatic chuck having the mounting surface comprising a first member that is fixed on an upper surface at a peripheral portion of the base and a second member that is not fixed, and a variable control mechanism comprising a heat transfer gas source and configured to variably control the contact area between the target object on the base and the mounting surface of the electrostatic chuck by vertically moving the second member by filling and discharging the heat transfer gas into and from the recess through the second flow path.

* * * * *